US009806171B2

(12) United States Patent
Kwok et al.

(10) Patent No.: US 9,806,171 B2
(45) Date of Patent: Oct. 31, 2017

(54) METHOD FOR MAKING SOURCE AND DRAIN REGIONS OF A MOSFET WITH EMBEDDED GERMANIUM-CONTAINING LAYERS HAVING DIFFERENT GERMANIUM CONCENTRATION

(71) Applicant: Taiwan Semiconductor Manufacturing Company, Ltd., Hsin-Chu (TW)

(72) Inventors: Tsz-Mei Kwok, Hsin-Chu (TW); Kun-Mu Li, Zhudong Township (TW); Hsueh-Chang Sung, Zhubei (TW); Chii-Horng Li, Zhubei (TW); Tze-Liang Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/149,756

(22) Filed: May 9, 2016

(65) Prior Publication Data
US 2016/0254364 A1  Sep. 1, 2016

Related U.S. Application Data

(62) Division of application No. 13/968,751, filed on Aug. 16, 2013, now Pat. No. 9,337,337.

(51) Int. Cl.
*H01L 21/20* (2006.01)
*H01L 21/8234* (2006.01)
(Continued)

(52) U.S. Cl.
CPC .. *H01L 29/66636* (2013.01); *H01L 21/02636* (2013.01); *H01L 21/265* (2013.01);
(Continued)

(58) Field of Classification Search
CPC ......... H01L 21/02636; H01L 21/76895; H01L 21/823814; H01L 29/66545; H01L 29/66628; H01L 29/66636; H01L 29/7848
See application file for complete search history.

(56) References Cited

U.S. PATENT DOCUMENTS 7,538,387 B2 * 5/2009 Tsai ............... H01L 29/165
257/327
7,943,969 B2  5/2011 Yang et al.
(Continued)

FOREIGN PATENT DOCUMENTS

CN  101425534 A  5/2009
CN  102610637 A  7/2012

*Primary Examiner* — Anh Mai
(74) *Attorney, Agent, or Firm* — Slater Matsil, LLP

(57) ABSTRACT

An integrated circuit structure includes a gate stack over a semiconductor substrate, and an opening extending into the semiconductor substrate, wherein the opening is adjacent to the gate stack. A first silicon germanium region is in the opening, wherein the first silicon germanium region has a first germanium percentage. A second silicon germanium region is over the first silicon germanium region, wherein the second silicon germanium region has a second germanium percentage higher than the first germanium percentage. A third silicon germanium region is over the second silicon germanium region, wherein the third silicon germanium region has a third germanium percentage lower than the second germanium percentage.

20 Claims, 12 Drawing Sheets

(51) Int. Cl.
  *H01L 29/78*      (2006.01)
  *H01L 29/66*      (2006.01)
  *H01L 21/02*      (2006.01)
  *H01L 21/8238*    (2006.01)
  *H01L 21/265*     (2006.01)
  *H01L 21/768*     (2006.01)

(52) U.S. Cl.
  CPC ............... *H01L 21/76895* (2013.01); *H01L 21/823814* (2013.01); *H01L 29/7847* (2013.01); *H01L 29/7848* (2013.01); *H01L 29/66545* (2013.01); *H01L 29/66628* (2013.01)

(56) References Cited

U.S. PATENT DOCUMENTS

| | | | |
|---|---|---|---|
| 8,324,043 B2 * | 12/2012 | Kim | H01L 21/26506 257/E21.634 |
| 8,338,831 B2 * | 12/2012 | Tamura | H01L 21/823807 257/190 |
| 8,344,447 B2 * | 1/2013 | Lin | H01L 29/165 257/327 |
| 8,563,382 B2 * | 10/2013 | Nishikawa | H01L 21/823807 257/408 |
| 8,815,713 B2 | 8/2014 | Sung et al. | |
| 9,627,512 B2 * | 4/2017 | Cheng | H01L 29/66636 |
| 9,666,686 B2 * | 5/2017 | Li | H01L 29/66636 |
| 2003/0017667 A1 | 1/2003 | Park et al. | |
| 2007/0235802 A1 | 10/2007 | Chong et al. | |
| 2009/0108308 A1 | 4/2009 | Yang et al. | |
| 2012/0181625 A1 | 7/2012 | Kwok et al. | |
| 2013/0207166 A1 | 8/2013 | Chen et al. | |
| 2013/0234217 A1 * | 9/2013 | Lin | H01L 29/66636 257/288 |
| 2015/0021688 A1 | 1/2015 | Sung et al. | |
| 2015/0021696 A1 | 1/2015 | Sung et al. | |
| 2015/0041852 A1 | 2/2015 | Kwok et al. | |
| 2015/0214366 A1 * | 7/2015 | Chang | H01L 29/7848 257/192 |

* cited by examiner

METHOD FOR MAKING SOURCE AND DRAIN REGIONS OF A MOSFET WITH EMBEDDED GERMANIUM-CONTAINING LAYERS HAVING DIFFERENT GERMANIUM CONCENTRATION

This application is a divisional of U.S. patent application Ser. No. 13/968,751, filed on Aug. 16, 2013, and entitled "MOS Device Having Source and Drain Regions with Embedded Germanium-Containing Diffusion Barrier," which application is hereby incorporated herein by reference.

BACKGROUND

Metal-Oxide Semiconductor (MOS) devices are key components of integrated circuits. The performance of MOS devices affects the performance of the entire integrated circuits in which the MOS devices are located. Therefore, methods for improving the performance of the MOS devices have been studied.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Reduction in the size and the inherent features of semiconductor devices (e.g., Metal-Oxide Semiconductor (MOS) devices) has enabled continued improvement in speed, performance, density, and cost per unit function of integrated circuits over the past few decades. In accordance with a design of the MOS devices and one of the inherent characteristics thereof, modulating the length of a channel region underlying a gate between a source and drain of a MOS device alters a resistance associated with the channel region, thereby affecting a performance of the MOS device. More specifically, shortening the length of the channel region reduces a source-to-drain resistance of the MOS device, which, assuming other parameters are maintained relatively constant, may allow an increase in the current flow between the source and drain when a sufficient voltage is applied to the gate of the MOS device.

To further enhance the performance of MOS devices, stress may be introduced into the channel region of a MOS device to improve carrier mobility. Generally, it is desirable to induce a tensile stress in the channel region of an n-type MOS ("NMOS") device in a source-to-drain direction, and to induce a compressive stress in the channel region of a p-type MOS ("PMOS") device in a source-to-drain direction.

An available method for applying compressive stresses to the channel regions of PMOS devices is growing SiGe stressors in the source and drain regions. Such a method typically includes the steps of forming a gate stack on a semiconductor substrate, forming spacers on sidewalls of the gate stack, forming recesses in the silicon substrate along the gate spacers, and epitaxially growing SiGe stressors in the recesses. The epitaxy SiGe stressors apply a compressive stress to the channel region, which is located between a source SiGe stressor and a drain SiGe stressor.

A process for forming a Metal-Oxide-Semiconductor (MOS) device with stressors is provided in accordance with various exemplary embodiments. The intermediate stages of forming the MOS device are illustrated. The variations of the embodiments are discussed. Throughout the various views and illustrative embodiments, like reference numbers are used to designate like elements.

Figure 1:
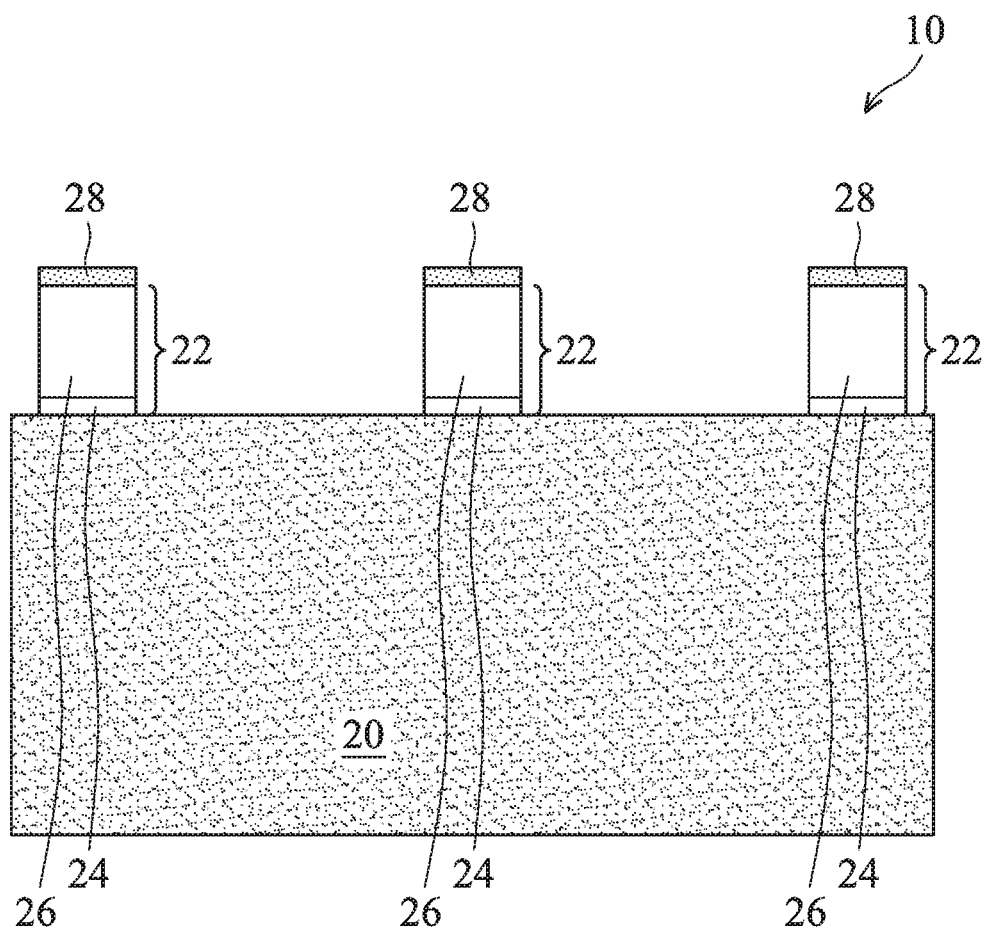
FIGS. 1 through 11 are cross-sectional views of intermediate stages in the manufacturing of a Metal-Oxide Semiconductor (MOS) device in accordance with some exemplary embodiments.

FIG. 1 illustrates substrate 20, which is a portion of wafer 10. Substrate 20 may be a bulk semiconductor substrate such as a silicon substrate, or may have a composite structure such as a Silicon-On-Insulator (SOI) structure. Alternatively, other semiconductor materials that include group III, group IV, and/or group V elements may also be comprised in substrate 20, which semiconductor materials may include silicon germanium, silicon carbon, and/or III-V compound semiconductor materials.

Gate stacks 22 are formed over substrate 20, and include gate dielectrics 24 and gate electrodes 26. Gate dielectrics 24 may comprise silicon oxide and/or a high-k material having a high k value, for example, higher than about 7. Gate electrodes 26 may include commonly used conductive materials such as doped polysilicon, metals, metal silicides, metal nitrides, and combinations thereof. Gate stacks 22 may also include hard masks 28, which may comprise silicon nitride, for example, although other materials such as silicon carbide, silicon oxynitride, and the like may also be used. In the embodiments in which replacement gates are formed, hard mask 28 may be, or may not be, formed.

Figure 2:
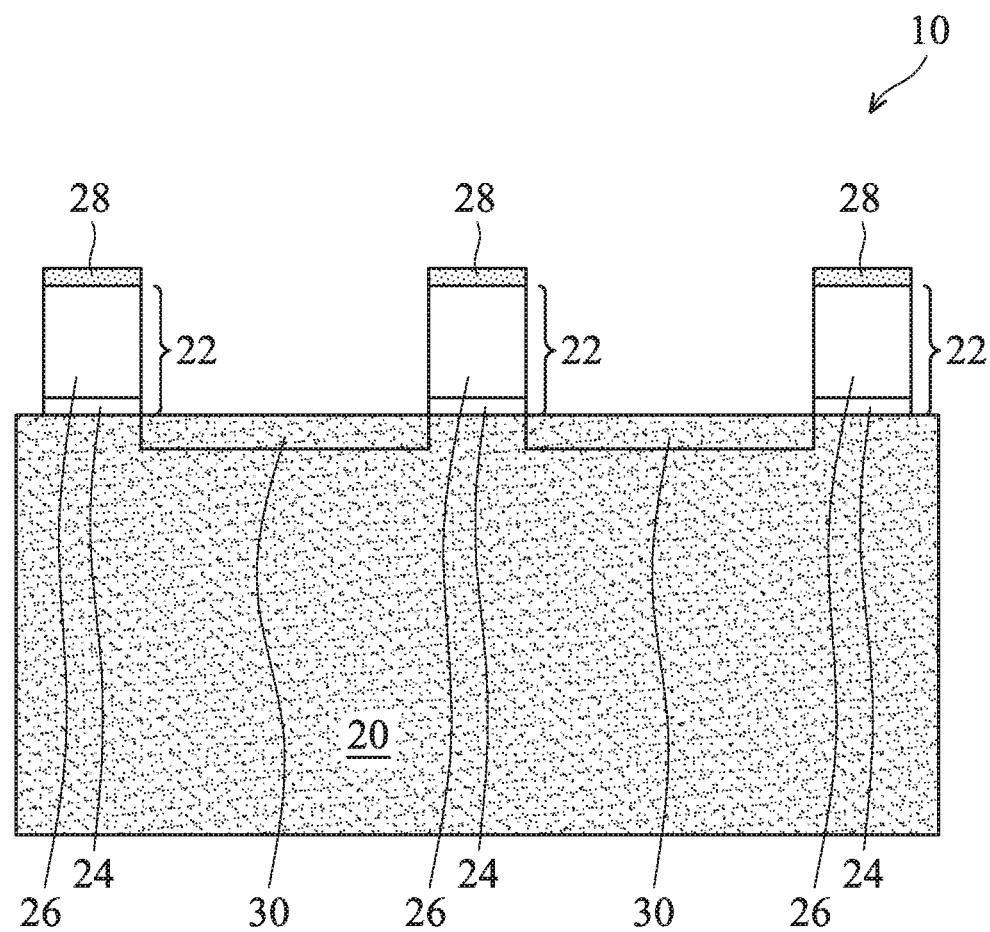

As shown in FIG. 2, Lightly Doped Drain/source (LDD) regions 30 are formed, for example, by implanting a p-type impurity such as boron and/or indium into substrate 20. Gate stacks 22 and hard masks 28 act as implantation masks so that the inner edges of LDD regions 30 are substantially aligned with the edges of gate stacks 22, respectively. The LDD implantation may be performed using energies in a range between about 1 keV and about 10 keV, and a dosage in a range between about $1 \times 10^{13}/cm^2$ and about $1 \times 10^{16}/cm^2$. It is appreciated, however, that the values recited throughout the description are merely examples, and may be changed to different values. The LDD implantation may be tilted or vertical, with the tilt angle in a range between about 0 degree and about 30 degrees. In addition, pocket regions 32 may also be formed, for example, by implanting an n-type impurity such as arsenic, phosphorus, or the like into substrate 20. The pocket implantation may be tilted, with the tilt angle greater than the tilt angle of the LDD implantation. In some embodiments, the tilt angle of the pocket implantation is in a range between about 15 degree and about 45 degrees. For clarity, pocket regions 32 are not illustrated in subsequent drawings.

Figure 3:
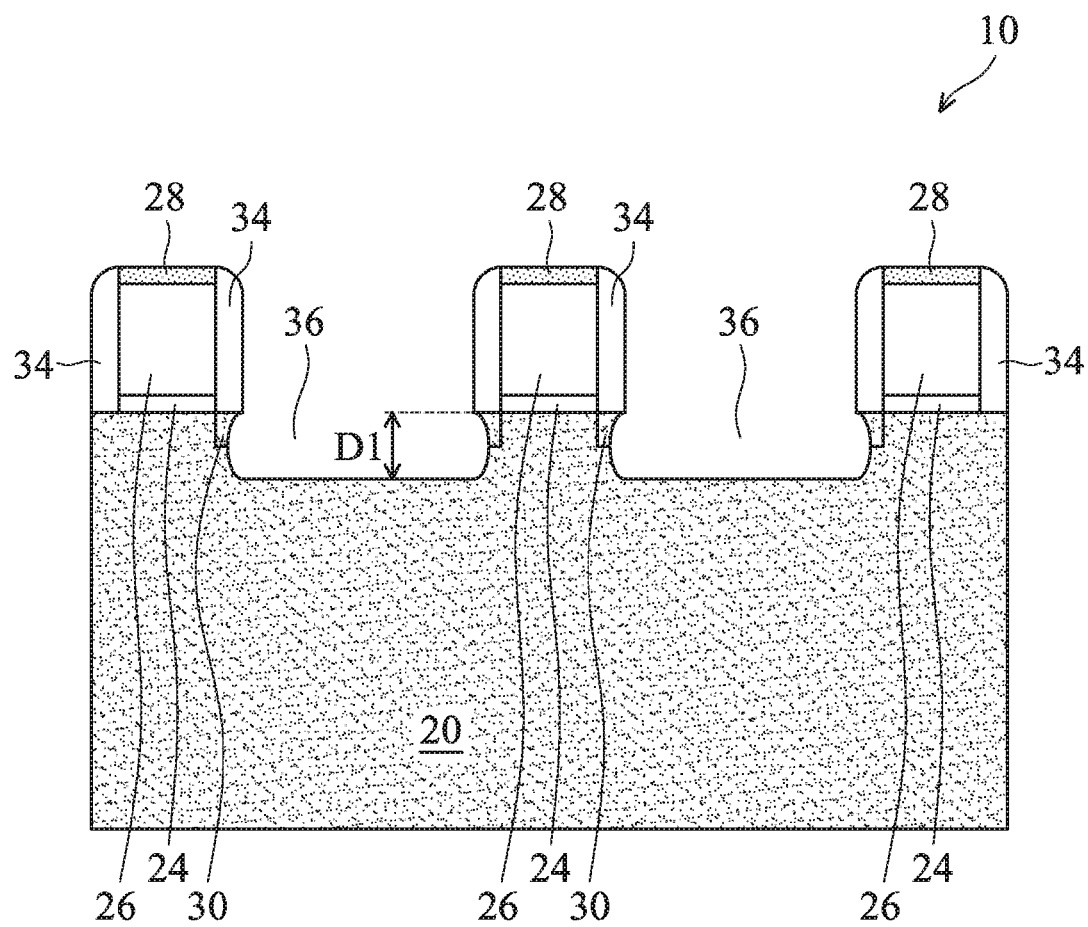

Referring to FIG. 3, gate spacers 34 are formed on the sidewalls of gate dielectrics 24 and gate electrodes 26. In some embodiments, each of gate spacers 34 includes a silicon oxide layer (not shown) and a silicon nitride layer over the silicon oxide layer, wherein the silicon oxide layer may have a thickness in a range between about 15 Å and about 50 Å, and the thickness of the silicon nitride layer may be in a range between about 50 Å and about 200 Å. In alternative embodiments, gate spacers 34 include one or more layers, each comprising silicon oxide, silicon nitride, silicon oxynitride, and/or other dielectric materials. The available formation methods include Plasma Enhanced Chemical Vapor Deposition (PECVD), Low-Pressure Chemical Vapor Deposition (LPCVD), Sub-Atmospheric Chemical Vapor Deposition (SACVD), and other deposition methods.

As also shown in FIG. 3, in accordance with some embodiments, an isotropic etch may be performed to form openings 36 in substrate 20. The isotropic etch may be a dry etch, wherein the etching gas may be selected from $CF_4$, $Cl_2$, $NF_3$, $SF_6$, and combinations thereof. Depth D1 of opening 36 may be in a range between about 150 Å and about 500 Å, for example. In alternative embodiments, the isotropic etch step in FIG. 3 is skipped, and the step in FIG. 4 is performed to form openings 36 as shown in FIG. 4.

Figure 4:
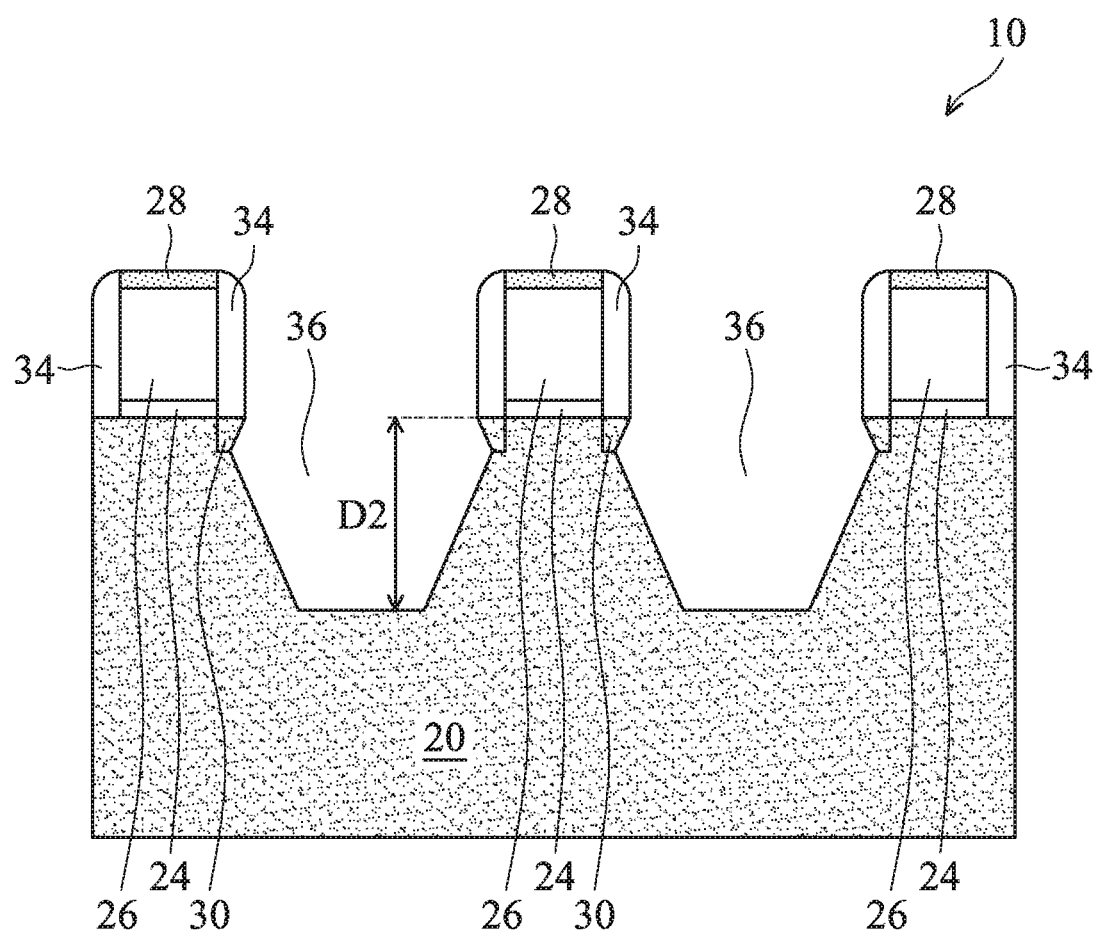

Next, as shown in FIG. 4, a wet etch is performed to expand openings 36. The wet etching may be performed, for example, using Tetra-Methyl Ammonium Hydroxide (TMAH), a potassium hydroxide (KOH) solution, or the like. In some exemplary embodiments, the TMAH solution has a concentration in a range between about 1 percent and about 30 percent. After the wet etching, facets may be formed in openings 36, which facets include (111) planes of substrate 20. In some exemplary embodiments, after the wet etching, depth D2 of openings 36 may be in a range between about 300 Å and about 800 Å, for example.

A pre-clean may be performed, for example, using an HF-based gas or a SiCoNi-based gas. The pre-clean may remove the silicon oxide that is formed as a result of the nature oxidation of the exposed surfaces in openings 36.

Figure 5:
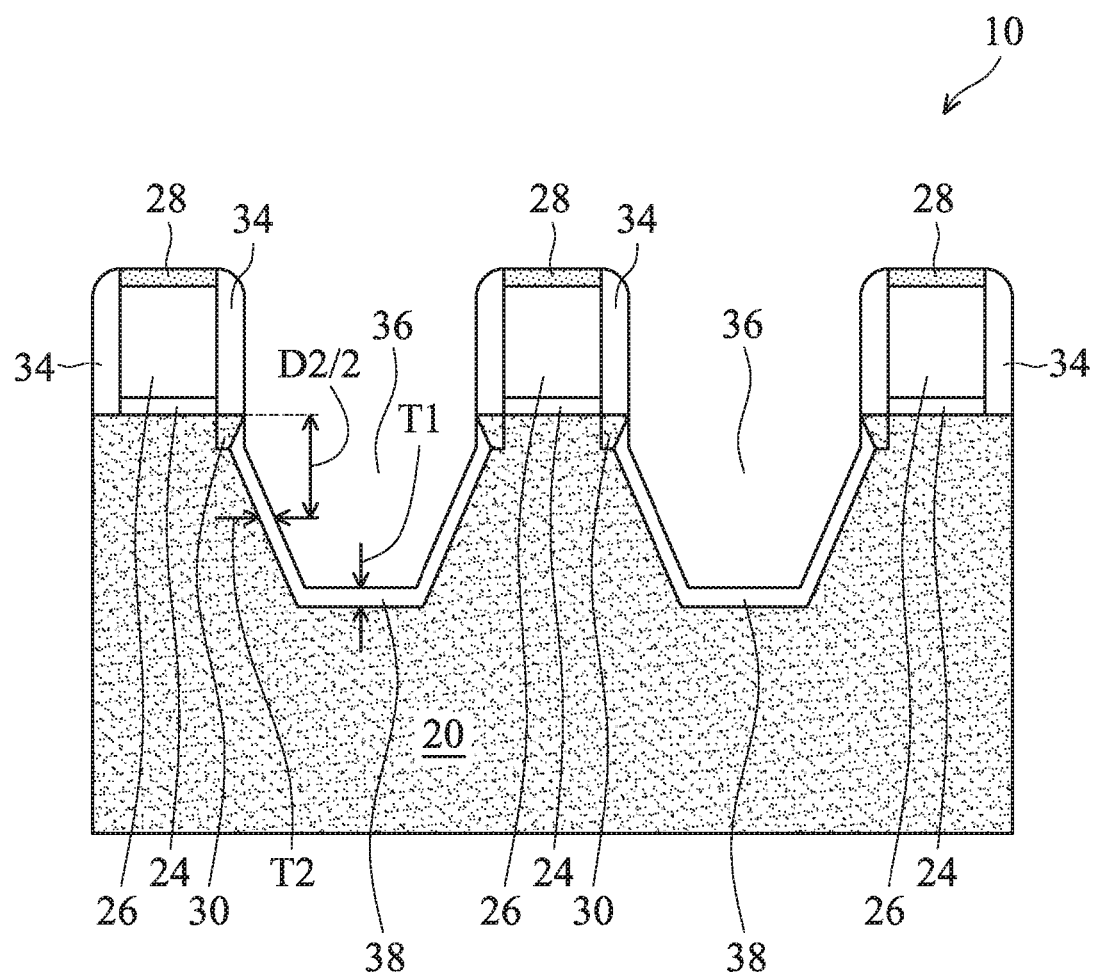

FIG. 5 illustrates the formation of Silicon Germanium (SiGe) layers 38, which are formed as thin layers. During the epitaxy, SiGe is epitaxially grown in openings 36 (FIG. 4) through Selective Epitaxial Growth (SEG), forming SiGe layers 38. The process gases may include $H_2$, $N_2$, dichlorosilane (DCS), $SiH_4$, $GeH_4$, and/or the like. The temperature of wafer 10 during the epitaxy may be in a range between about 600° C. and about 900° C. In some embodiments, an etching gas is added to promote the selective growth on the exposed surfaces of substrate 20, but not on dielectrics such as gate spacers 34 and hard masks 28. The pressure of the process gases may be in a range between about 10 torr and about 200 torr.

In some embodiments, during the epitaxy of SiGe layers 38, no p-type impurity is in-situ doped, or substantially no p-type impurity (for example, with a p-type impurity concentration lower than about $10^{14}/cm^3$) is doped. In alternative embodiments, during the epitaxy, p-type impurities are doped while the growth proceeds. For example, when boron is to be doped, $B_2H_6$ may be included in the process gases. The p-type impurities in SiGe layers 38 may be doped to a first p-type impurity concentration PC1 lower than about $1E20/cm^3$. SiGe layers 38 may have a first germanium atomic percentage GP1 in a range between about 10 percent and about 30 percent, for example, although different germanium percentages may also be used.

SiGe layers 38 are formed as thin layers. In some embodiments, thickness T1 of SiGe layers 38, which thickness is the thickness of the bottom portions of SiGe layers 38, is smaller than about 20 nm. Thickness T1 may also be in a range between about 5 nm and about 30 nm. Furthermore, distance T2 is between about 1 nm and about 20 nm. Distance T2 is the lateral distance between the left edge and the right edge of the sidewall portions of SiGe layers 38, wherein distance T2 is measured at a depth equal to D2/2, which is a half of the depth D2 of recess 36. Maintaining values T1 and T2 to be greater than certain values (for example, about 1 nm) may advantageously keep the subsequently formed germanium-rich layers 40 (FIG. 6) not to be too close to substrate 20. This in turn results in the reduction of the defects caused by the lattice mismatch between germanium-rich layers 40 and substrate 20. On the other hand, maintaining values T1 and T2 to be small enough, for example, smaller than about 20 nm, may maintain the benefit of reducing boron diffusion, as will be discussed subsequently.

Figure 6:
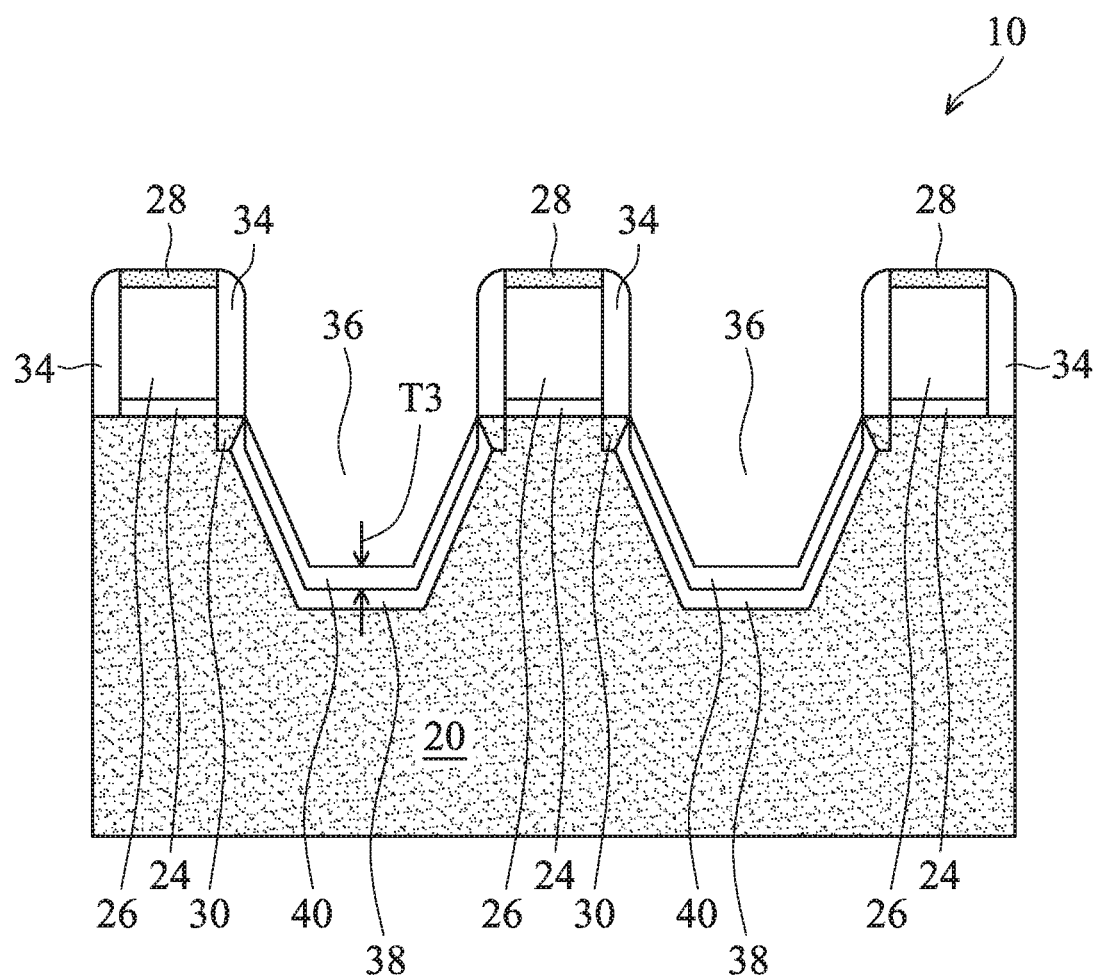

Referring to FIG. 6, epitaxy layers 40 are grown over SiGe layers 38 through an epitaxy process. In some embodiments, epitaxy layers 40 are SiGe layers, which have a germanium atomic percentage significantly higher than the germanium atomic percentage in SiGe layers 38. Throughout the description, epitaxy layers 40 are referred to as germanium-rich SiGe layers. When the epitaxy of germanium-rich SiGe layers 40 starts, the process conditions are adjusted, and the flow rate ratio of the flow rate of germanium-containing precursors (such as $GeH_4$) to the flow rate of silicon-containing precursors (such as $SiH_4$) is significantly increased. As a result, germanium-rich SiGe layers 40 have a second germanium atomic percentage GP2 significantly greater than germanium percentage GP1 in SiGe layers 38. In some exemplary embodiments, germanium atomic percentage GP2 is in a range between about 30 percent and about 60 percent. Germanium percentage difference (GP2−GP1) may be between about 10 percent and about 50 percent. Thickness T3 of germanium-rich SiGe layers 40 may be between about 1 nm and about 10 nm in some embodiments.

Furthermore, during the epitaxy for forming epitaxy regions 40, a p-type impurity may be in-situ doped with the proceeding of the epitaxy. The p-type impurity concentration in epitaxy regions 40 is greater than the p-type impurity concentration in SiGe layers 38. In some embodiments, ratio PIM40/PIM38, which is the ratio of p-type impurity concentration PIM40 in epitaxy regions 40 to p-type impurity concentration PIM38 in SiGe layers 38, is greater than about 3. Ratio PIM40/PIM38 may also be greater than about 2 in some embodiments.

Figure 7:
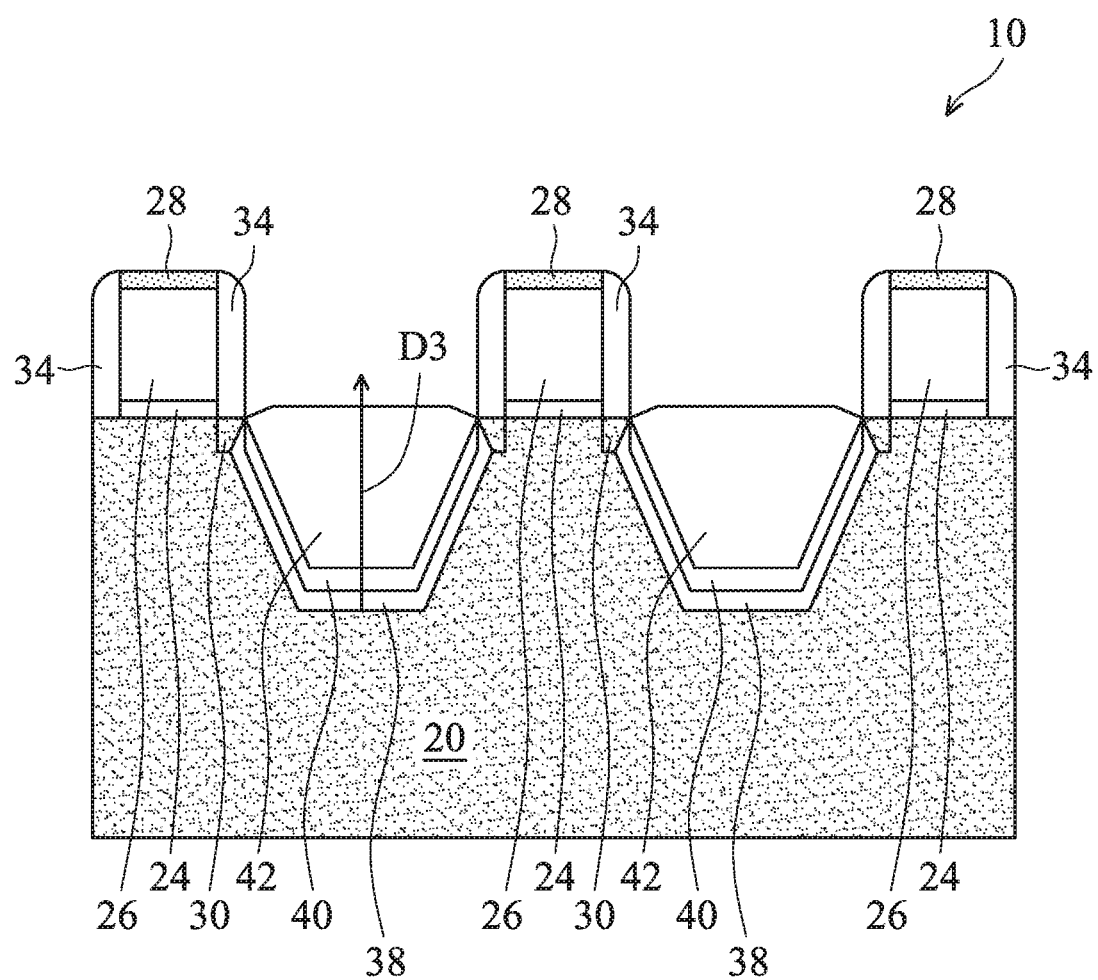

Referring to FIG. 7, epitaxy layers 42 are grown over epitaxy regions 40 through an epitaxy process. In some embodiments, epitaxy layers 42 are SiGe layers, which have a germanium atomic percentage GP3 significantly lower than the germanium atomic percentage GP2 in SiGe layers 40. Epitaxy layers 42 are referred to as SiGe layers 42 hereinafter. When the epitaxy of SiGe layers 42 starts, the process conditions are adjusted, and the flow rate ratio of the flow rate of germanium-containing precursors (such as $GeH_4$) to the flow rate of silicon-containing precursors (such as $SiH_4$) is significantly reduced. As a result, germanium atomic percentage GP3 in SiGe layers 42 is significantly lower than germanium percentage GP2 in epitaxy regions 40. In some exemplary embodiments, germanium atomic percentage GP3 is in a range between about 20 percent and about 50 percent. Germanium percentage difference (GP2−GP3) may be between about 10 percent and about 50 percent. The formation of epitaxy regions 42 finishes when the top surfaces of SiGe layers 42 are level with or higher than the interface between gate dielectric 24 and substrate 20.

During the epitaxy for forming epitaxy regions 42, a p-type impurity may be in-situ doped with the proceeding of the epitaxy. Furthermore, the p-type impurity concentration in epitaxy regions 42 is greater than the p-type impurity in SiGe layers 38. In some embodiments, the p-type impurity concentration PIM42 in epitaxy regions 42 and the p-type impurity concentration PIM38 in SiGe layers 38 have a ratio PIM42/PIM38, which is greater than about 3. Ratio PIM42/PIM38 may also be greater than about 2 in some embodiments.

In some embodiments, in each of SiGe layers 38 and 42, the germanium percentage as deposited is substantially uniform. In alternative embodiments, either one or both of SiGe layers 38 and 42 has gradually and continuously changed germanium percentages. During the respective epitaxy, the flow rate of the germanium-containing precursor (such as GeH$_4$) may be gradually and continuously changed. In these embodiments, in the layer in which the germanium percentages gradually change, the lower portions of the layer have germanium percentages lower than the germanium percentages of the upper portions, the resulting germanium profile in regions 38 and 42 may be similar to what are shown in FIG. 12.

Figure 12:
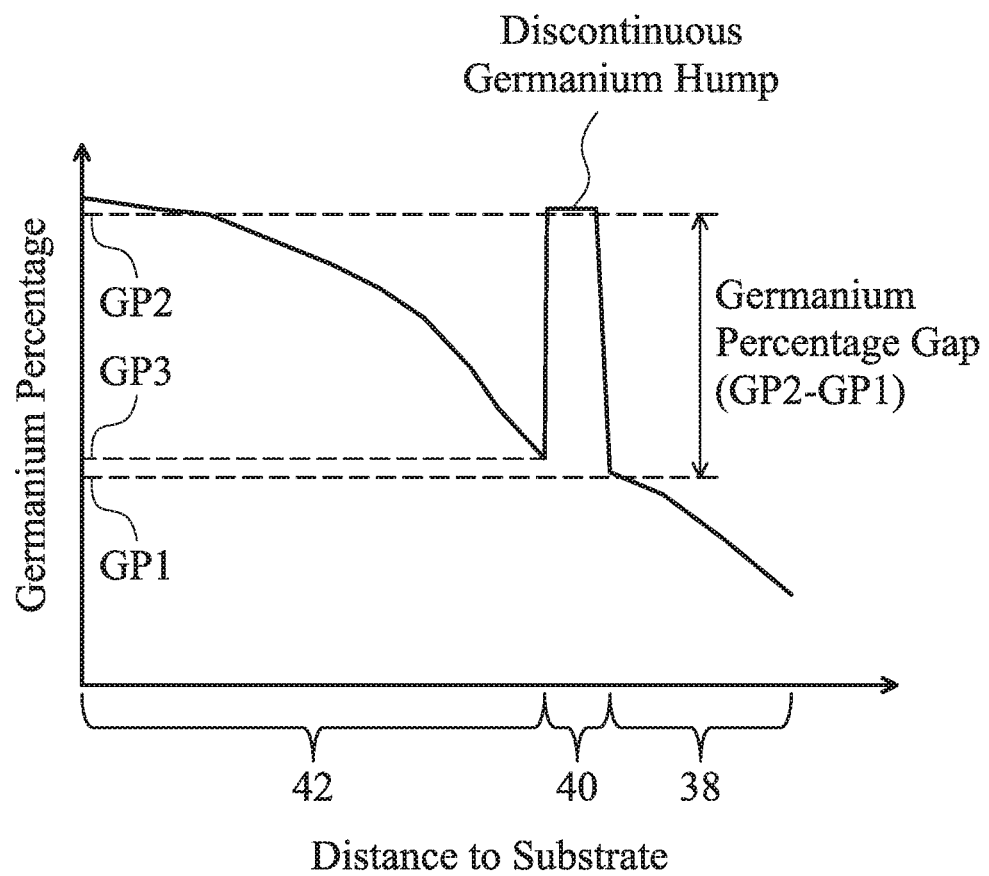
FIG. 12 schematically illustrates an exemplary profile of germanium percentages in the epitaxy regions of the MOS device in accordance with some embodiments.

FIG. 12 schematically illustrates germanium percentages in SiGe layers 38, 40, and 42 as functions of the vertical distance from the respective regions to the top surface of substrate 20. The vertical distance is marked as D3 in FIG. 7. Regions 38, 40, and 42 and the respective germanium concentrations GP1, GP2, and GP3 are marked in FIG. 12. FIG. 12 illustrates that regions 38 and 42 have continuously increased germanium percentages, and a germanium percentage hump is generated in region 40 due to the abrupt increase in the germanium percentage from GP1 to GP2 and the abrupt reduction from GP2 to GP3.

Figure 8:
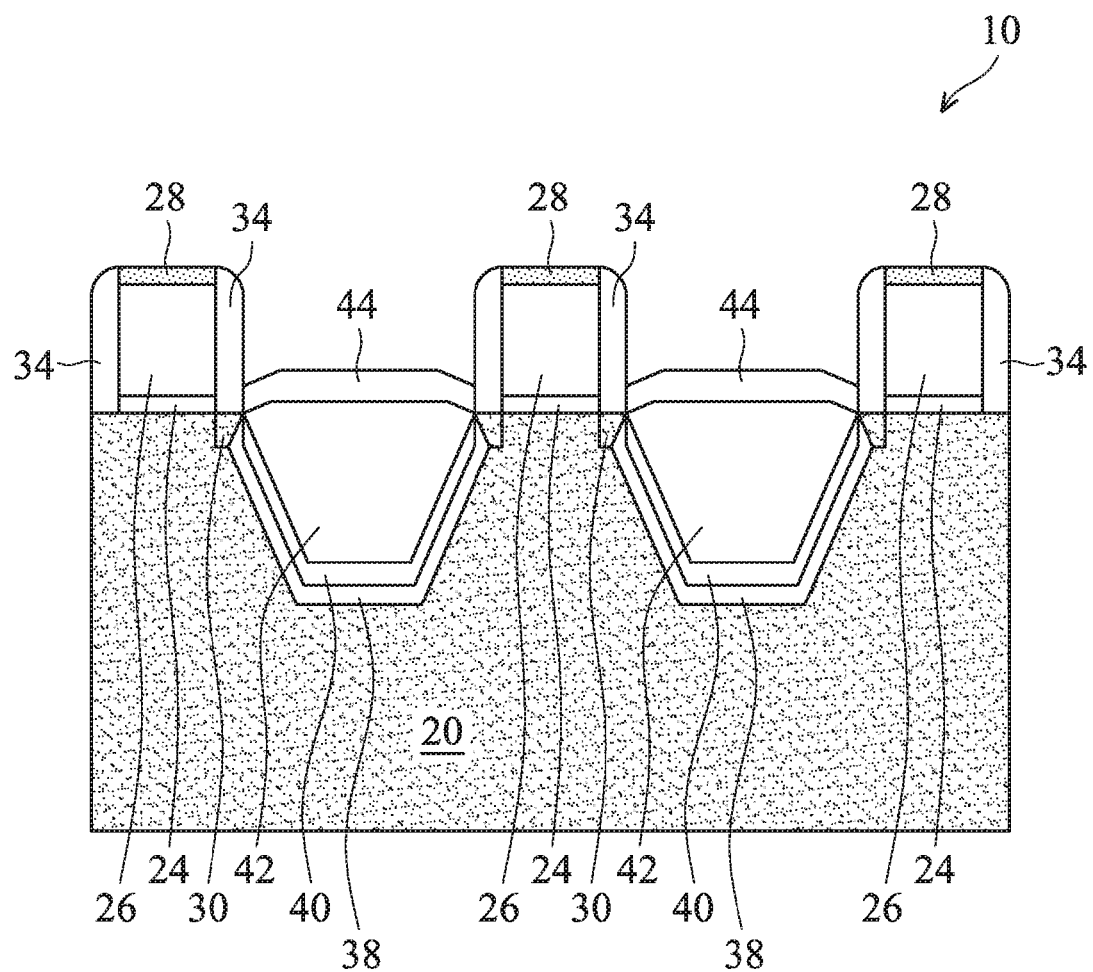

After the formation of SiGe regions 42, capping layers 44 are formed over SiGe regions 42 through epitaxy, as shown in FIG. 8. Capping layers 44 may have a composition (including the elements contained therein and the percentages of the elements) different from the composition of SiGe regions 42. Capping layers 44 may be pure silicon layers with no germanium comprised therein, or substantially pure silicon layers with, for example, less than 2 percent, or 1 percent, germanium. Accordingly, capping layers 44 are alternatively referred to as silicon caps throughout the description. Capping layers 44 may be in-situ doped with p-type impurities with the proceeding of the epitaxy, or not in-situ doped. In the embodiments that no p-type impurity or substantially no p-type impurity is doped during the epitaxy of SiGe layers 38, 42, and/or capping layers 44, a p-type impurity implantation may be performed to form source and drain regions for the respective MOS device.

Figure 9:
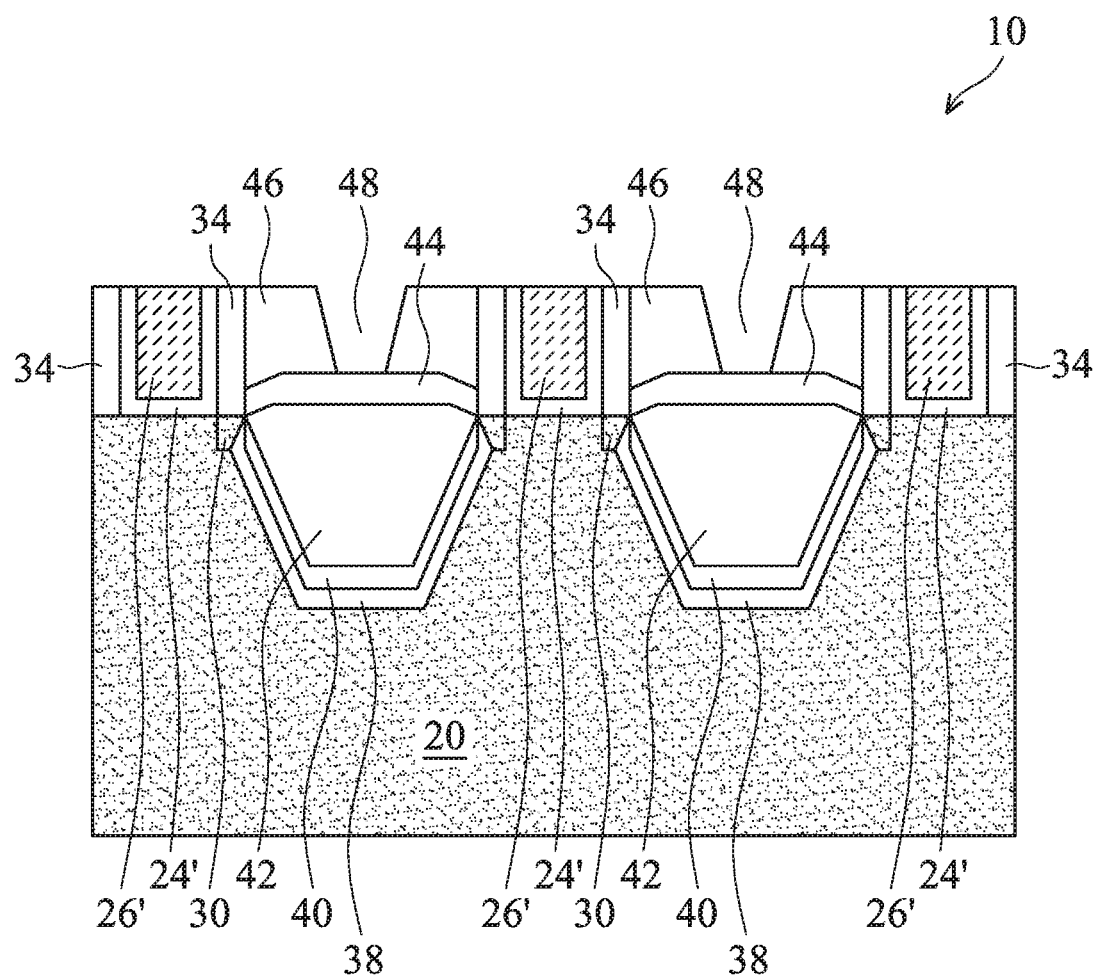

Next, referring to FIG. 9, hard masks 28 (refer to FIG. 8), if any, are removed, and replacement gates are formed to replace gate dielectrics 24 and gate electrodes 26 in accordance with some embodiments. In alternative embodiments, gate dielectrics 24 and gate electrodes 26 are not replaced with replacement gates. In the embodiments replacement gates are formed, gate dielectrics 24 and gate electrodes 26 (FIG. 8) act as dummy gates that are removed. FIG. 9 illustrates an exemplary structure including the replacement gates. The formation process may include forming Inter-Layer Dielectric (ILD) 46, performing a CMP to level the top surfaces of ILD 46 with the top surface of gate electrodes 26 (or hard mask 28, if any), and removing the dummy gates. A gate dielectric layer and a gate electrode layer may then be formed to fill the openings left by the removed dummy gates, followed by a CMP to remove excess portions of the gate dielectric layer and the gate electrode layer. The remaining replacement gates include gate dielectrics 24' and gate electrodes 26'. Gate dielectrics 24' may comprise a high-k dielectric material with a k value greater than about 7.0, for example, and gate electrodes 26' may comprise a metal or a metal alloy. ILD 46 may be formed of a dielectric material such as Phospho-Silicate Glass (PSG), Boro-Silicate Glass (BSG), Boron-Doped Phospho-Silicate Glass (BPSG), or the like. Next, contact openings 48 are formed, exposing underlying capping layers 44.

Figure 10:
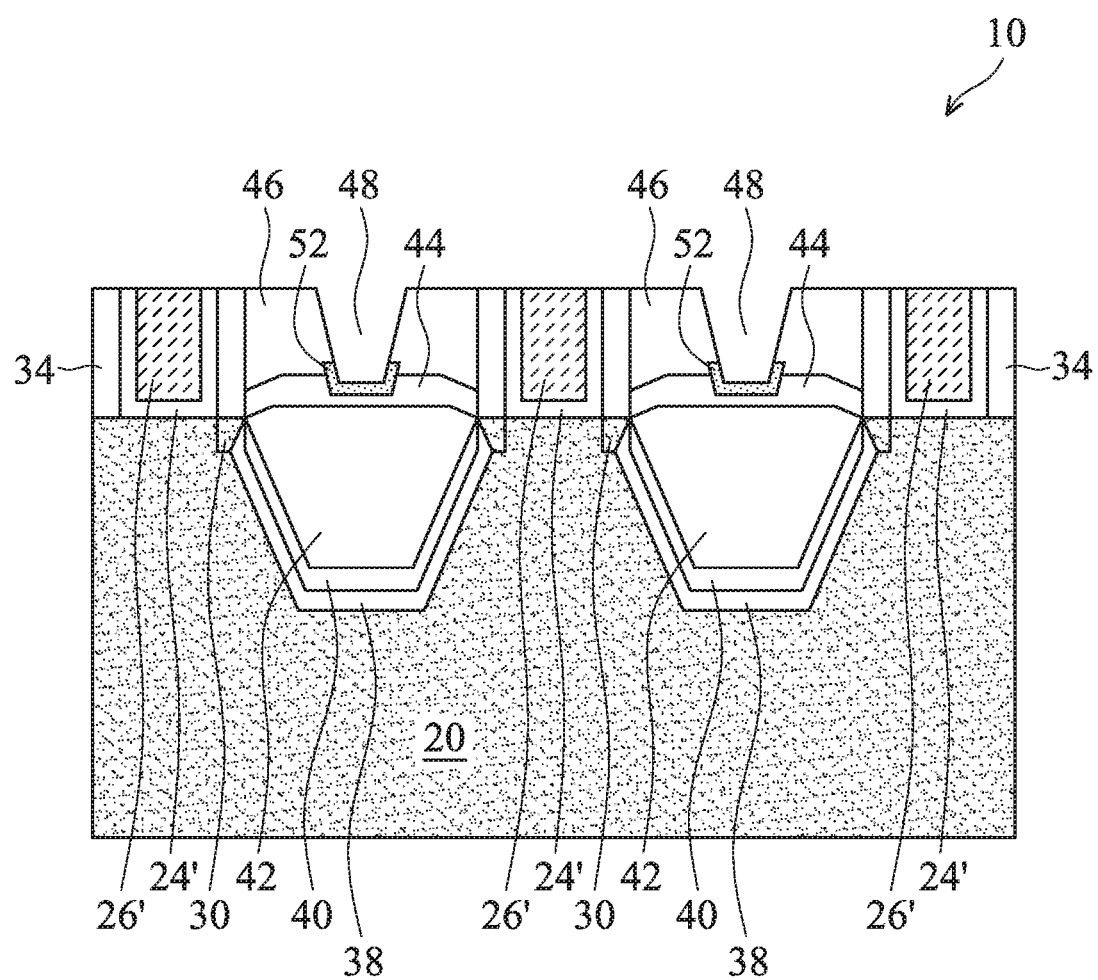

FIG. 10 illustrates the formation of source/drain silicide regions 52. Silicide regions 52 may be formed by depositing a thin layer (not shown) of a silicide metal, such as titanium, cobalt, nickel, tungsten, or the like, over the devices, including the exposed surfaces of capping layers 44. A anneal is then performed to react the metal with silicon/germanium. After the reaction, a layer of metal silicide is formed between silicon and the metal. The un-reacted metal is selectively removed through the use of an etchant that attacks the metal but does not attack silicide. As a result of the silicidation, source/drain silicide regions 52 extend into capping layers 44, and may extend into SiGe layers 42. Alternatively, the top portions of capping layers 44 are silicided, and the bottom portions of capping layers 44 are not silicided. After the silicidation, there may be some remaining portions of capping layers 44 remaining not silicided, wherein the remaining portions 44 are level with, and are on the opposite sides of, source/drain silicide regions 52.

Figure 11:
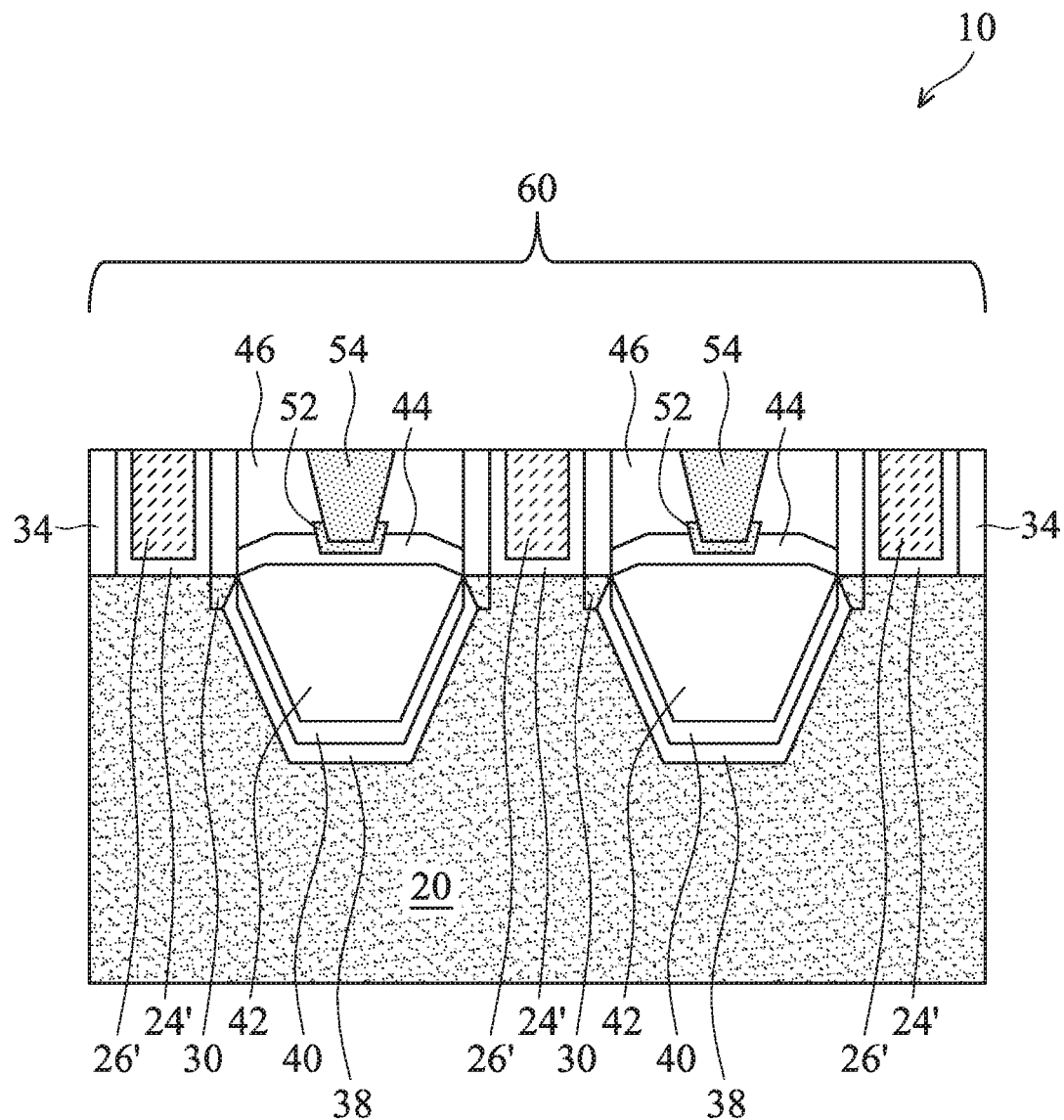

FIG. 11 illustrates the formation of source/drain contact plugs 54, which are formed by filling a conductive material such as tungsten, copper, aluminum, titanium, cobalt, silicon, germanium, and/or the like, into openings 48, and performing a CMP to level the top surface of contact plugs 54 with the top surface of ILD 46. MOS transistor 60 is thus formed, which includes epitaxy layers 38, 40, 42, and possibly the remaining portions of capping layers 44 as the source and drain regions.

The embodiments of the present disclosure have some advantageous features. High germanium regions have good ability for preventing the diffusion of boron. Therefore, by forming germanium-rich SiGe layers adjacent to the substrate, the boron diffusion from the source/drain regions of the MOS device to the substrate may be retarded by germanium-rich SiGe layers. The germanium-rich SiGe layers and the SiGe regions above may thus have high-boron concentrations without the concern of having too much boron diffused in to channels. Since a thin layer of SiGe with a low germanium percentage is inserted between each of the germanium-rich SiGe layers and the substrate, the defects caused by lattice mismatch between the germanium-rich SiGe layers and the substrate is minimized.

In accordance with some embodiments, an integrated circuit structure includes a gate stack over a semiconductor substrate, and an opening extending into the semiconductor substrate, wherein the opening is adjacent to the gate stack. A first silicon germanium region is in the opening, wherein the first silicon germanium region has a first germanium percentage. A second silicon germanium region is over the first silicon germanium region, wherein the second silicon germanium region has a second germanium percentage higher than the first germanium percentage. A third silicon germanium region is over the second silicon germanium region, wherein the third silicon germanium region has a third germanium percentage lower than the second germanium percentage.

In accordance with other embodiments, an integrated circuit structure includes a semiconductor substrate, a gate stack over the semiconductor substrate, wherein the gate stack is comprised in a MOS device, and a source/drain region of the MOS device extending into the semiconductor substrate. The source/drain region includes a first silicon germanium layer, a second silicon germanium layer over the first silicon germanium layer, and a third silicon germanium layer over the second silicon germanium layer. The first silicon germanium layer has a first germanium percentage. The second silicon germanium layer has a second germanium percentage greater than the first germanium percentage by about 10 percent. The third silicon germanium layer has a third germanium percentage lower than the second germanium percentage by about 10 percent. A metal silicide region is over and electrically coupled to the third silicon germanium layer.

In accordance with yet other embodiments, a method includes forming a gate stack over a semiconductor substrate, and forming an opening extending into the semiconductor substrate, wherein the opening is on a side of the gate stack. A first epitaxy is performed to grow a first silicon germanium layer in the opening, wherein the first silicon germanium layer has a first germanium percentage. A second epitaxy is performed to grow a second silicon germanium layer over the first silicon germanium layer, wherein the second silicon germanium layer has a second germanium percentage higher than the first germanium percentage. A third epitaxy is performed to grow a third silicon germanium layer over the second silicon germanium layer, wherein the third silicon germanium layer has a third germanium percentage lower than the second germanium percentage.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
forming a gate stack over a semiconductor substrate;
forming an opening extending into the semiconductor substrate, wherein the opening is on a side of the gate stack;
performing a first epitaxy to grow a first silicon germanium layer in the opening, wherein the first silicon germanium layer has a first germanium percentage;
performing a second epitaxy to grow a second silicon germanium layer over the first silicon germanium layer, wherein the second silicon germanium layer has a second germanium percentage higher than the first germanium percentage; and
performing a third epitaxy to grow a third silicon germanium layer over the second silicon germanium layer, wherein the third silicon germanium layer has a third germanium percentage lower than the second germanium percentage, each of the first and the third silicon germanium layers having a continuously increased germanium percentage, with higher portions of each of the first and the third silicon germanium layers having germanium percentages higher than germanium percentages in respective lower portions.

2. The method of claim 1 further comprising:
at a transition time from the first epitaxy to the second epitaxy, increasing a flow rate ratio of a flow rate of germanium-containing precursors to a flow rate of silicon-containing precursors; and
at a transition time from the second epitaxy to the third epitaxy, reducing the flow rate ratio.

3. The method of claim 1 further comprising:
forming a silicon cap over and contacting the third silicon germanium layer, wherein the silicon cap is substantially free from germanium.

4. The method of claim 3 further comprising:
after forming the silicon cap, forming an Inter-Layer Dielectric (ILD) over the gate stack and the silicon cap;
forming a contact opening in the ILD, wherein the silicon cap is exposed to the contact opening;
after the contact opening is formed, performing a silicidation on the silicon cap; and
filling the contact opening with a conductive material.

5. The method of claim 3 further comprising:
after forming the silicon cap, performing a silicidation to silicide the silicon cap.

6. The method of claim 1, wherein during the first epitaxy, no p-type impurity is in-situ doped, and wherein during the second epitaxy, a p-type impurity is in-situ doped.

7. The method of claim 1, wherein the first silicon germanium layer, the second silicon germanium layer, and the third silicon germanium layer form a source/drain region of a Metal-Oxide-Semiconductor (MOS) device.

8. The method of claim 1, wherein the second germanium percentage of the second silicon germanium layer is constant.

9. The method of claim 1, wherein at an interface of the first silicon germanium layer and the second silicon germanium layer, there is an abrupt increase from the first germanium percentage to the second germanium percentage, and wherein at an interface of the second silicon germanium layer and the third silicon germanium layer, there is an abrupt decrease from the second germanium percentage to the third germanium percentage.

10. A method comprising:
forming a gate stack over a substrate;
forming a source/drain region adjacent to the gate stack, the source/drain region extending from a top surface of the substrate into the substrate, the forming the source/drain region comprising:
performing a first epitaxy to grow a first silicon germanium layer, the first silicon germanium layer having a first germanium percentage;
increasing a flow rate ratio of a flow rate of germanium-containing precursors to a flow rate of silicon-containing precursors;
performing a second epitaxy with the increased flow rate ratio to grow a second silicon germanium layer over the first silicon germanium layer, the second silicon germanium layer having a second germanium percentage higher than the first germanium percentage;

reducing the flow rate ratio of a flow rate of germanium-containing precursors to a flow rate of silicon-containing precursors; and performing a third epitaxy with the reduced flow rate ratio to grow a third silicon germanium layer over the second silicon germanium layer, the third silicon germanium layer having a third germanium percentage lower than the second germanium percentage, the third germanium percentage continuously increasing along a bottom-to-top direction.

11. The method of claim 10, wherein at an interface of the first silicon germanium layer and the second silicon germanium layer, there is an abrupt increase from the first germanium percentage to the second germanium percentage, and wherein at an interface of the second silicon germanium layer and the third silicon germanium layer, there is an abrupt decrease from the second germanium percentage to the third germanium percentage.

12. The method of claim 11, wherein the first germanium percentage continuously increases along the bottom-to-top direction such that a higher portion of the first silicon germanium layer has a higher germanium percentage than that of a lower portion of the first silicon germanium layer.

13. The method of claim lo further comprising:
forming a silicon cap over and contacting the third silicon germanium layer.

14. The method of claim 13 further comprising:
after forming the silicon cap, forming an Inter-Layer Dielectric (ILD) over the gate stack and the silicon cap;
forming a contact opening in the ILD to expose the silicon cap;
after the contact opening is formed, performing a silicidation on the silicon cap; and
filling the contact opening with a conductive material.

15. The method of claim 10, wherein during the first epitaxy, no p-type impurity is in-situ doped, and wherein during the second epitaxy, a p-type impurity is in-situ doped.

16. The method of claim 10, wherein during the first epitaxy, a p-type impurity is in-situ doped, and wherein during the second epitaxy, a p-type impurity is in-situ doped.

17. A method comprising:

forming a gate stack over a substrate;

forming an opening extending into the substrate, the opening being adjacent a side of the gate stack;

epitaxially growing a first silicon germanium layer in the opening, the first silicon germanium layer having a first germanium percentage;

epitaxially growing a second silicon germanium layer over the first silicon germanium layer, at an interface of the first silicon germanium layer and the second silicon germanium layer, there is an abrupt increase from the first germanium percentage to a second germanium percentage;

epitaxially growing a third silicon germanium layer over the second silicon germanium layer, at an interface of the second silicon germanium layer and the third silicon germanium layer, there is an abrupt decrease from the second germanium percentage to a third germanium percentage, wherein a higher portion of the third silicon germanium layer has a germanium percentage higher than a germanium percentage in a lower portion of the third silicon germanium layer;

forming a silicon cap over and contacting the third silicon germanium layer; and performing a silicidation to silicide the silicon cap.

18. The method of claim 17, wherein each of the first and the third silicon germanium layers having a continuously increased germanium percentage, with a higher portion of the first silicon germanium layer having a germanium percentage higher than a germanium percentage in a lower portion of the first silicon germanium layer.

19. The method of claim 18, wherein the second germanium percentage of the second silicon germanium layer is constant.

20. The method of claim 17, wherein during epitaxially growing the first silicon germanium layer, no p-type impurity is in-situ doped, and wherein during epitaxially growing the second silicon germanium layer, a p-type impurity is in-situ doped.

* * * * *